United States Patent [19]
Teng

[11] Patent Number: 6,054,397
[45] Date of Patent: Apr. 25, 2000

[54] BPSG PLANARIZATION METHOD HAVING IMPROVED PLANARITY AND REDUCED CHATTER MARK DEFECTS

[75] Inventor: Yung-nien Teng, Hsin-chu, Taiwan

[73] Assignees: ProMOS Technologies Inc.; Mosel Vitelic Inc., both of Hsinchu, Taiwan; Siemans AG, Munich, Germany

[21] Appl. No.: 09/363,306

[22] Filed: Jul. 28, 1999

[51] Int. Cl.$^7$ .................................................. H01L 21/304

[52] U.S. Cl. ........................ 438/783; 438/760; 438/633; 438/631

[58] Field of Search .................................... 438/631, 633, 438/760, 783

[56] References Cited

U.S. PATENT DOCUMENTS 5,223,734  6/1993  Lowrey et al. ............................ 437/12
5,633,211  5/1997  Imai et al. ............................... 438/760

*Primary Examiner*—Charles Bowers
*Assistant Examiner*—Lisa Kilday
*Attorney, Agent, or Firm*—Blakely Sokoloff Taylor and Zafman

[57] ABSTRACT

A method for improving the planarization of a BPSG layer over a semiconductor substrate, where the substrate contains underlying structures, is disclosed. The method comprises the steps of: forming a first borophosphosilicate glass (BPSG) layer over and between the underlying structures; reflowing the first BPSG layer using a thermal process; performing a chemical mechanical polishing (CMP) step on the first BPSG layer; forming a second BPSG layer over the first BPSG layer; and reflowing the second BPSG layer using a thermal process.

8 Claims, 1 Drawing Sheet

BPSG PLANARIZATION METHOD HAVING IMPROVED PLANARITY AND REDUCED CHATTER MARK DEFECTS

FIELD OF THE INVENTION

The present invention relates to planarization, and more specifically, to a method of improving the planarization of borophosphosilicate glass (BPSG) by using an additional BPSG film with reflow.

BACKGROUND OF THE INVENTION

There has been great progress in the field of integrated circuit fabrication. The trend has been to reduce the size of semiconductor devices. In addition, multiple layers of interconnections between devices are now used. A subsequent layer is generally formed on an underlying layer. In order to achieve a better topography, a planarization process is quite often used to obtain a planar surface. Thus, planarization is the key way to make sure that a layer has a planar surface. If one of the multiple layers has poor topography, then this results in alignment problems for subsequent layers.

Typically, during the formation of ICs, borophosphosilicate glass (BPSG) is used as an interlayer dielectric for integrated circuits. This is due to the fact that BPSG is applied in liquid form and therefore exhibits good planarization capabilities. The BPSG is formed by using a low pressure chemical vapor deposition (LPCVD) process using a reactant gas, such as tetraethylorthosilicate (TEOS) to which are added dopant gases, for example phosphine ($PH_3$) and diborane ($B_2H_6$).

Referring to FIG. 1, when a BPSG layer 101 is used as an interlayer dielectric, it is often formed over and between underlying structures 103, such as gate structures and similar devices. In a typical process, the BPSG layer is first reflowed and then planarized using a chemical planarization process (CMP). Typically, the underlying structures have a top cap layer of silicon nitride that is used as a stop layer for the CMP process.

Planarization by the CMP presents several problems. The removal rate of the BPSG oxide by the CMP is higher than the removal rate of the cap nitride on the underlying structures 103, causing a dishing effect 105 in wide trenches. This dishing effect degrades the planarity of a layer, and it also impacts the yield of the device. Further, the CMP process produces "chatter mark defects" 109 in the BPSG layer 101 and on the underlying structures 103.

As semiconductor devices are scaled down, it is more important than ever to have a planar defect free BPSG surface. The present invention provides a method to achieve an improved planar and defect free surface for the BPSG layer.

SUMMARY OF THE INVENTION

A method for improving the planarization of a BPSG layer over a semiconductor substrate, where the substrate contains underlying structures, is disclosed. The method comprises the steps of: forming a first borophosphosilicate glass (BPSG) layer over and between said underlying structures; reflowing said first BPSG layer using a thermal process; performing a chemical mechanical polishing (CMP) step on said first BPSG layer; forming a second BPSG layer over said first BPSG layer; and reflowing said second BPSG layer using a thermal process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method for the planarization for borophosphosilicate glass (BPSG) is described herein. Referring to FIG. 2, the starting point for the method of the present invention is similar to the prior art of FIG. 1. Specifically, a first BPSG layer is deposited over the underlying structures. The first BPSG layer preferably has a boron dopant level of between 3–5% (and more preferably 4.7%), a phosphorous level of between 4–5% (and more preferably 4.4%), and is deposited over about 30 minutes. The thickness of the first BPSG layer is between about 4750 and 5750 angstroms The first BPSG layer is reflowed for about 15 to 60 minutes (and more preferably 30 minutes) at about 800–950° C. (and more preferably 850° C.).

Figure 1:
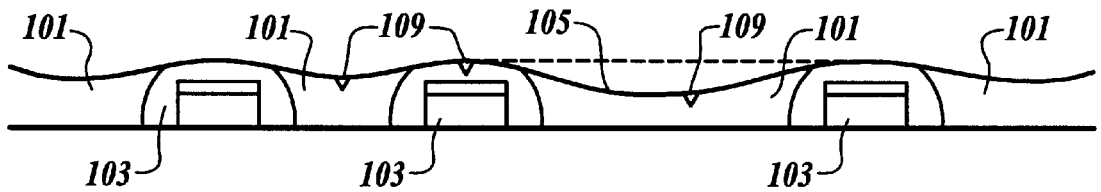
FIG. 1 is a cross section view of a semiconductor wafer illustrating defects in a prior art BPSG process.
Figure 2:
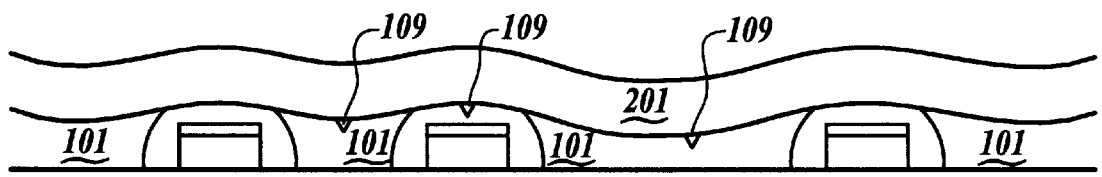
FIG. 2 is a cross section view of a semiconductor wafer illustrating the step of forming a second BPSG layer in accordance with the present invention.

In particular, an additional BPSG layer 201 is deposited over the structure shown in FIG. 1. The second BPSG layer 201 is deposited using a LPCVD with tetraethylorthosilicate (TEOS) as the reactant gas. Dopant gases, such as phosphine ($PH_3$) and diborane ($B_2H_6$), are added into the TEOS gas flow. Preferably, the thickness of the second BPSG layer 201 is between 2000 and 5000 angstroms. The second BPSG layer 201 has a boron dopant level of 4–7% and a phosphorous dopant level of 1–4%. Note that the deposition of the second BPSG layer 201 fills the chatter mark defects 109.

Figure 3:
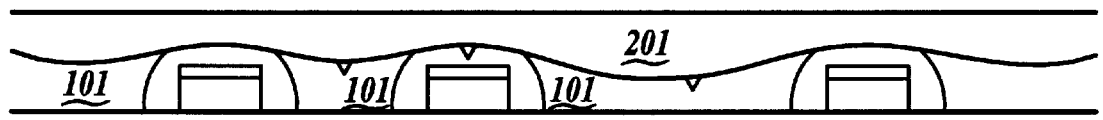
FIG. 3 is a cross section view of a semiconductor wafer illustrating the step of reflowing the second BPSG layer in accordance with the present invention.

Subsequently, referring to FIG. 3, a thermal process is carried out to reflow the second BPSG layer 201, thereby increasing the planarity of the second BPSG layer 201. Preferably, the reflow process is performed for 10–45 minutes at a temperature of 800–950° C. The surface of the BPSG layer 201 is then made more planar, as shown in FIG. 3. The dishing effect of the prior art is substantially eliminated by the formation of a reflowed second BPSG layer 201.

Importantly, to maintain the thermal budget for the entire process, the reflow of the first and second BPSG layers 101 and 201 is performed for a time period that is half of the normal reflow time. Thus, the total thermal budget of both the reflow steps is equivalent to the prior art. Specifically, the reflow of the first BPSG layer 101 may be for 15–60 minutes (more preferably 30 minutes) at a temperature of 800–950° C. The reflow of the second BPSG layer 201 may be for 10–45 minutes at a temperature of 800–950° C. In the prior art, the reflow of the first BPSG layer 101 may be substantially over 60 minutes at a temperature of 800–950° C. Therefore, it can seen that the method of the present invention stays within the prior art thermal budget.

Optionally, an additional thick layer of CVD or TEOS oxide may be deposited atop the second BPSG layer 201 to complete the interlayer dielectric.

While the preferred embodiment of the invention has been illustrated and described, it will be appreciated that various changes can be made therein without departing from the spirit and scope of the invention.

What is claimed is:

1. A method for improving the planarization of a BPSG layer over the frontside of a semiconductor substrate, said substrate containing underlying structures, said method comprising:

forming a first borophosphosilicate glass (BPSG) layer over and between said underlying structures;

reflowing said first BPSG layer using a thermal process;

after reflowing said first BPSG layer, performing a chemical mechanical polishing (CMP) on said first BPSG layer;

forming a second BPSG layer over said first BPSG layer after said first BPSG layer is polished by said CMP; and reflowing said second BPSG layer using a thermal process.

2. The method of claim 1 further including the step of forming a tetraethylorthosilicate (TEOS) oxide over said second BPSG layer.

3. The method of claim 1, wherein the temperature of said thermal processes are about 800–950° C.

4. The method of claim 3 wherein the time for the reflow of said first BPSG layer is between 15 and 60 minutes and the time for the reflow of said second BPSG layer is between 10 and 45 minutes.

5. The method of claim 1, wherein the thickness of said second BPSG layer is between 2000 and 5000 angstroms.

6. The method of claim 1, wherein the thickness of said first BPSG layer is between 4750 and 5750 angstroms.

7. The method of claim 5, wherein the thickness of said first BPSG layer is between 4750 and 5750 angstroms.

8. The method of claim 1 wherein said first BPSG layer has a boron dopant level of between 3–5% and a phosphorous level of between 4–5% and said second BPSG layer has a boron dopant level of 4–7% and a phosphorous dopant level of 1–4%.

* * * * *